United States Patent [19]

Davidge et al.

[11] Patent Number: 5,083,931
[45] Date of Patent: Jan. 28, 1992

[54] DEVICE GROUNDING SPRING

[75] Inventors: Ronald V. Davidge, Coral Springs; John R. Dewitt, Boca Raton, both of Fla.

[73] Assignee: International Business Machines Corporation, Armonk, N.Y.

[21] Appl. No.: 700,676

[22] Filed: May 15, 1991

[51] Int. Cl.⁵ .............................................. H01R 4/66
[52] U.S. Cl. ................................... 439/108; 439/607
[58] Field of Search ..................... 439/108, 607, 609

[56] References Cited

U.S. PATENT DOCUMENTS

| | | | |
|---|---|---|---|
| 2,825,042 | 2/1958 | Tollefson et al. | 339/253 |
| 2,844,644 | 7/1958 | Soule, Jr. | 174/35 |
| 3,277,230 | 10/1966 | Stickney et al. | 174/35 |
| 3,426,140 | 2/1969 | Templeton | 174/35 |
| 4,652,695 | 3/1987 | Busby | 174/35 |
| 4,737,888 | 4/1988 | Bodnar et al. | 439/108 X |
| 4,868,716 | 9/1989 | Taylor et al. | 361/424 |
| 4,872,090 | 10/1989 | Taylor et al. | 361/424 |
| 4,889,959 | 12/1989 | Taylor et al. | 174/35 |
| 4,943,244 | 7/1990 | Teck et al. | 439/607 X |

FOREIGN PATENT DOCUMENTS 0292765  11/1989  Japan ................................. 439/108

Primary Examiner—Eugene F. Desmond
Attorney, Agent, or Firm—Richard A. Tomlin; Ronald V. Davidge

[57] ABSTRACT

Electrical grounding is provided for an optional device in a computer system, and a gap of varying width adjacent to the device is filled with a conductive shield, by means of a flexible grounding spring having a folded central section from which tabs extend in one direction to contact a conductive surface of the device and in the opposite direction to contact a conductive surface of the machine framework. This grounding spring is held by means of a mounting bracket having a slot through which the folded central section extends to be held in place by locking tabs formed in this section.

5 Claims, 2 Drawing Sheets

DEVICE GROUNDING SPRING

BACKGROUND OF THE INVENTION

This invention relates to means for providing electrical grounding and shielding, as required to prevent emission of radiation which could interfere with communication signals.

In general, it is intended for use in the installation of an optional device within a computer unit, where electrical grounding of the device to a machine framework is required, and where provisions for the installation of various optional devices in the computer unit results in a space adjacent to the device, which must be filled with a conductive shield.

The use of flexible springs to provide electrical grounding and shielding is familiar in the art. However, such springs are generally mounted firmly to the device to make flexible contact with the framework, or to the framework to make flexible contact with the device. Flexible contact with both device and framework surfaces has the advantage of allowing electrical contact between the spring and the surfaces to be maintained in spite of variations in the geometry of either surface.

SUMMARY OF THE INVENTION

Electrical grounding is provided for an optional device in a computer system, and a gap of varying width adjacent to the device is filled with a conductive shield, by means of a flexible grounding spring having a folded central section from which tabs extend in one direction to contact a conductive surface of the device and in the opposite direction to contact a conductive surface of the machine framework. This grounding spring is held by means of a mounting bracket having a slot through which the folded central section extends to be held in place by locking tabs formed in this section.

The spring is configured to be deflected inward, thereby being variable in width to cover a gap of varying width.

Means are provided for holding the contact spring in place without welding and without additional fasteners.

The invention described herein can be used e.g. to provide electrical grounding for a Compact Disk Read Only Memory (CDROM) mounted in e.g. an IBM Personal System/2 Model 60, 70, or 80.

DESCRIPTION OF A PREFERRED EMBODIMENT

Figure 1:
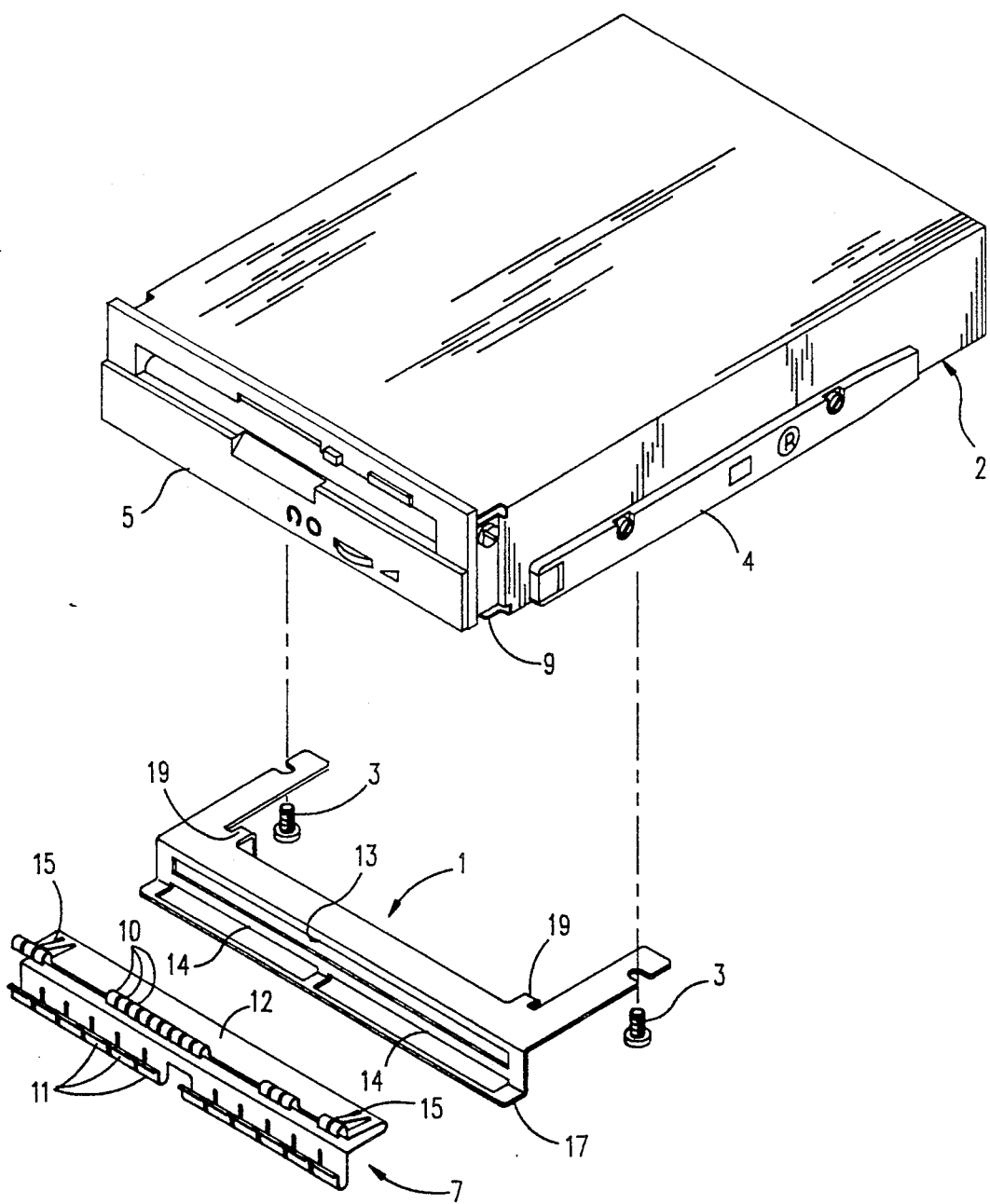
FIG. 1 is a partially exploded view of the device, the grounding spring, and the spring bracket.

Referring to FIG. 1, a spring bracket generally designated 1 is attached to surface 21 (see FIG. 3) of an option device generally designated 2 by means of screws 3. The option device includes rails 4 mounted on opposite sides of device 2, which are used for mounting device 2 in a computer. Bezel 5 forms a cover surface over the front of the device.

Figure 2:
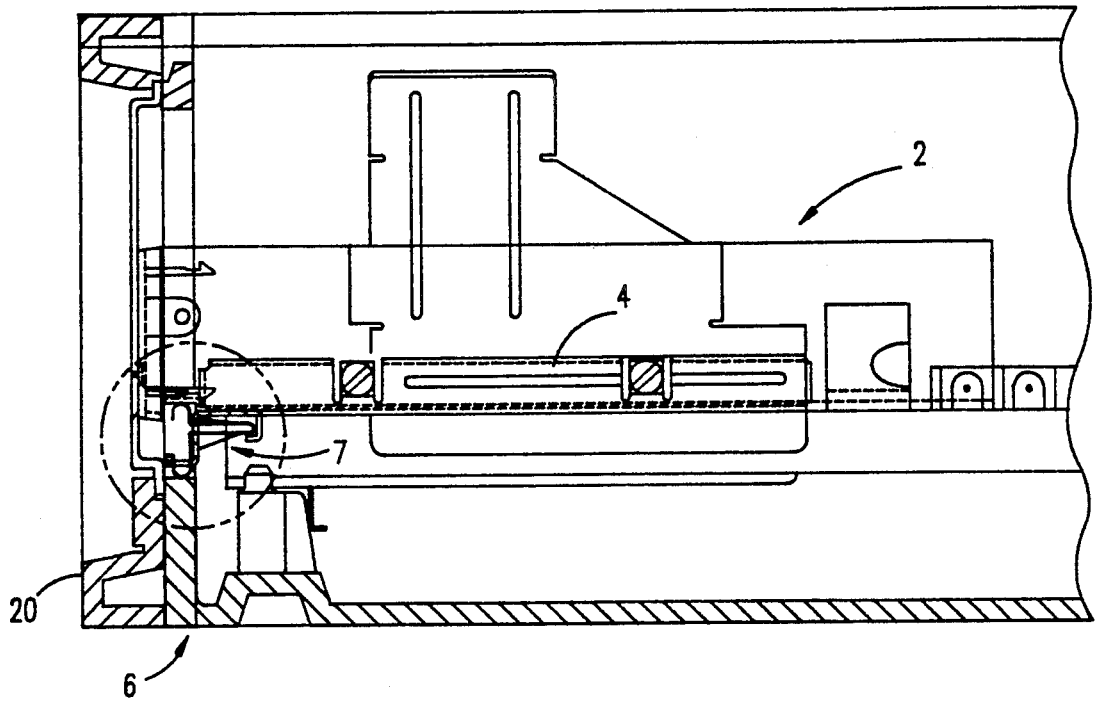
FIG. 2 is a partial cross-sectional view of the device installed in a unit cover.
Figure 3:
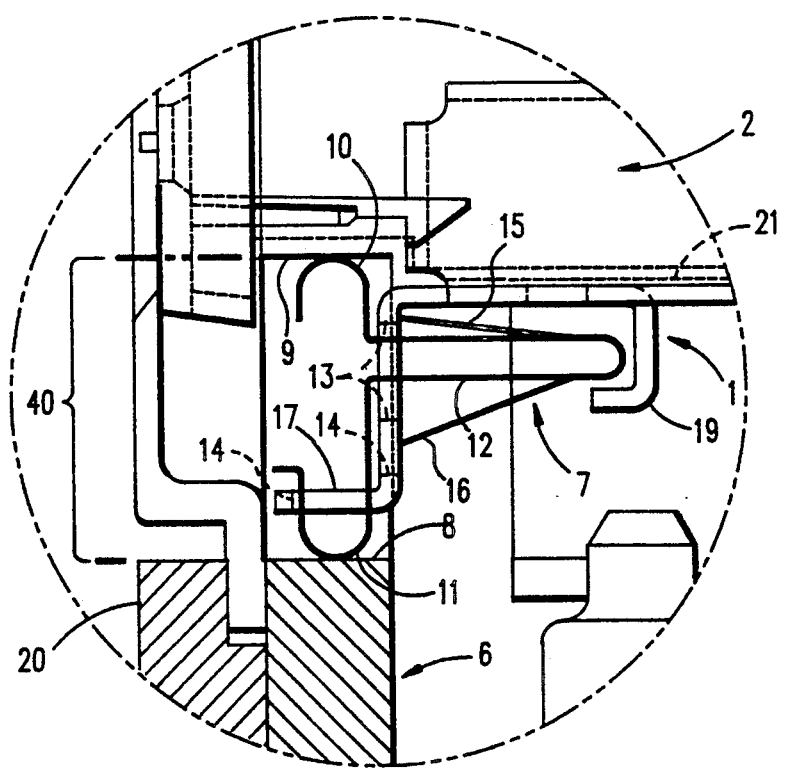
FIG. 3 is a partial cross-sectional view of the grounding spring and spring bracket.

Referring to FIGS. 2 and 3, when option device 2 is mounted within a machine framework, generally designated 6, a gap 40 having a variable width is formed between conductive surface 8 of machine framework 6 and adjacent surface 9 of option device 2. The width of gap 40 between surface 9 and framework 6 is variable because of allowable dimensional variations in machine framework 6, in option device 2, and in the means used to attach these devices. In order to prevent radiation of electromagnetic energy through gap 40, which could interfere with communication signals, gap 40 must be largely filled with a conductive grounded shield. Small holes and slots in such a shield have no significant effect on the efficiency of radiation suppression. As is well known in the art, in order to prevent such radiation from option device 2, this device must be electrically grounded to machine framework 6 by means capable of carrying radio-frequency electrical signals with a relatively low impedance. This is achieved by the use of flexible grounding spring generally designated 7 attached within spring bracket 1, which electrically grounds option device 2 to conductive surface 8 of machine framework 6, and which fills gap 40 between conductive surface 8 and conductive surface 9 of option device 2.

Grounding spring 7 includes a number of device tabs 10, formed to contact conductive surface 9 of option device 2, a number of frame tabs 11, formed to contact conductive surface 8 of machine framework 6, and a flexible section 12, which is folded to provide flexibility between device tabs 10 and frame tabs 11. Spring bracket 1 includes central slot 13, through which flexible section 12 of grounding spring 7 extends, following the assembly of grounding spring 7 into spring bracket 1 and slots 14, through which frame tabs 11 extend. Grounding spring 7 also includes, near each end, an upper locking tab 15 and a lower locking tab 16.

In the process of assembling grounding spring 7 into spring bracket 1, which can occur either before or after spring bracket 1 is fastened to option device 2 by means of screws 3, flexible section 12 is pushed through the opening of central slot 13, and frame tabs 11 are pushed through the openings of slot 14. As this occurs, locking tabs 15 and locking tabs 16 are deflected inward by the edges of slot 13. As insertion is completed, locking tabs 15, 16 flex outward to hold spring 7 in spring bracket 1 without screws or other additional fasteners. A second bezel 20 snaps over device 2 and against framework 6 to retain device 2 in the framework 6 by means not shown.

It should be noted that, while the function of grounding spring 7 could be obtained without the presence of leg 17 of spring bracket 1, in which slots 14 are formed, the presence of leg 17 helps protect grounding spring 7 from damage caused by handling during various assembly processes.

Spring bracket 1 is also provided with spring stops 19 to prevent spring 7 from being inserted far enough into slot 13 to damage frame tabs 10, 11. It can be seen that grounding spring 7 which is made of a conductive material, provides electrical continuity between conductive surface 9 of option device 2 and conductive surface 8 of machine framework 6.

Although a specific preferred embodiment has been disclosed, modifications may be made which do not depart from the scope of the present invention as described in the following claims.

What is claimed is:

1. Apparatus for providing electrical continuity between a conductive surface of an option device and a conductive surface of a machine framework, said apparatus comprising:

a bracket configured for attachment to an option device, said bracket having a first portion extending therefrom including a first slot; and a flexible conductive member having a folded central portion for extending through said first slot, a device tab portion extending from said folded central portion to contact said device conductive surface, a frame tab portion extending from said folded central portion to contact said framework conductive surface; and, locking tabs in said folded central portion extending from a fold therein, configured to permit movement of said folded central portion through said first slot and to oppose removal of said folded central portion in said first slot.

2. Apparatus as described in claim 1, wherein said device tab portion and said frame tab portion of said flexible conductive member extend from said folded central portion in opposite directions.

3. Apparatus as described in claim 1, wherein said device tab portion of said flexible conductive member is divided into a plurality of tabs extending from said folded central portion.

4. Apparatus as described in claim 1, wherein said frame tab portion of said flexible conductive member is divided into a plurality of tabs extending from said folded central portion.

5. Apparatus as described in claim 1 wherein: said bracket comprises in addition a second portion, extending from said first portion, including a second slot; and frame tab portion of said flexible conductive member extends through said second slot.

* * * * *